United States Patent
Nicolaescu

(10) Patent No.: US 8,405,052 B2
(45) Date of Patent: Mar. 26, 2013

(54) ION IMPLANTER PROVIDED WITH BEAM DEFLECTOR AND ASYMMETRICAL EINZEL LENS

(75) Inventor: Dan Nicolaescu, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 385 days.

(21) Appl. No.: 12/905,525

(22) Filed: Oct. 15, 2010

(65) Prior Publication Data

US 2011/0220808 A1    Sep. 15, 2011

(30) Foreign Application Priority Data

Mar. 11, 2010  (JP) .................................. 2010-054245

(51) Int. Cl.
*H01J 37/317* (2006.01)
*H01L 21/265* (2006.01)

(52) U.S. Cl. ............................... 250/492.21; 250/396 R

(58) Field of Classification Search ............... 250/396 R
See application file for complete search history.

(56) References Cited

U.S. PATENT DOCUMENTS

| | | | |
|---|---|---|---|
| 4,922,106 A * | 5/1990 | Berrian et al. | 250/492.2 |
| 6,762,423 B2 * | 7/2004 | Liebert et al. | 250/492.21 |
| 6,881,966 B2 * | 4/2005 | Benveniste et al. | 250/492.21 |
| 7,759,658 B2 | 7/2010 | Nakashima | |
| 8,008,630 B2 * | 8/2011 | Yamashita | 250/396 R |
| 2009/0289193 A1 | 11/2009 | Yamashita | |

FOREIGN PATENT DOCUMENTS

JP    2008-34360    2/2008

* cited by examiner

*Primary Examiner* — Jack Berman
(74) *Attorney, Agent, or Firm* — Osha Liang LLP

(57) ABSTRACT

An ion implanter has a beam deflector having a pair of magnetic poles facing each other in a z direction, insulating members provided on the respective magnetic poles, at least one pair of electrodes provided on the insulating members so as to face each other across a space through which the ion beam passes in the z direction, and at least one power source configured to apply a voltage to the pair of electrodes. The beam deflector is configured to deflect, by a magnetic field, an overall shape of the ion beam so as to be substantially parallel to the x direction. The pair of electrodes have a dimension longer than the dimension of the ion beam in the y direction, and constitute an asymmetrical einzel lens in the direction of travel of the central orbit of the ion beam.

11 Claims, 13 Drawing Sheets

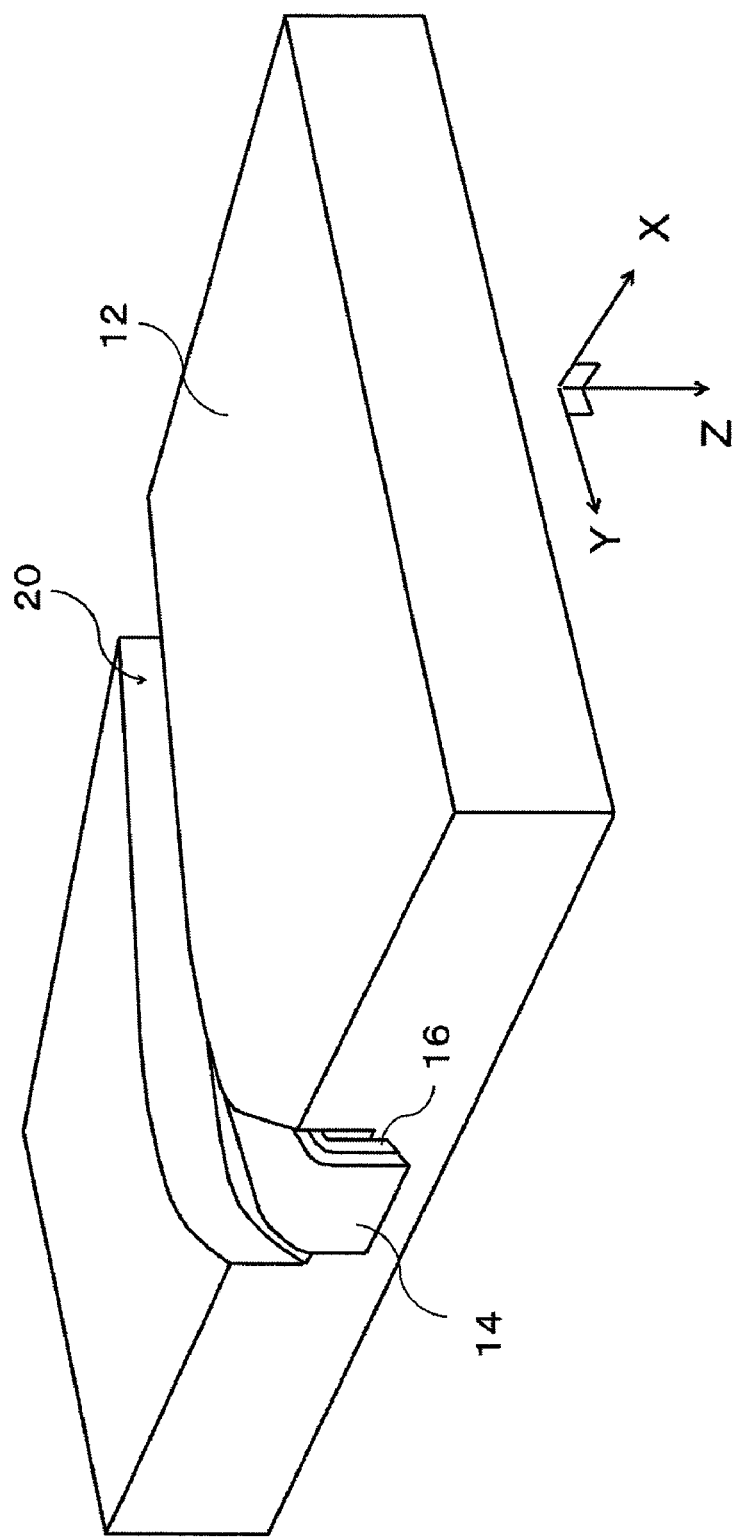

ION IMPLANTER PROVIDED WITH BEAM DEFLECTOR AND ASYMMETRICAL EINZEL LENS

CROSS REFERENCE TO RELATED APPLICATION(S)

This application is based upon and claims the benefit of priority from Japanese Patent Application No. 2010-54245 filed on Mar. 11, 2010, the entire contents of which are incorporated herein by reference.

1. Field

The present disclosure relates to an ion implanter having a beam deflector that shapes the outer shape of an ion beam so as to be parallel and an einzel lens that suppresses the spread of the ion beam due to the space charge effect.

2. Description of the Related Art

Various technologies for suppressing the spread of ion beams due to the space charge effect have been employed for ion implanters. An example of such technologies is to previously converge the ion beam with consideration given to the spread of the ion beam due to the space charge effect. An example of this technology is disclosed in Patent Reference 1.

Patent Reference 1 discloses an ion implanter in which a ribbon-like ion beam scanned by a scanner is deflected into a parallel ribbon-like beam by a beam deflector, is converged inward in the direction of the short side of the ribbon-like ion beam by a static lens disposed on the downstream side of the beam deflector and then, is applied onto the target.

Such a static lens includes three pairs of electrodes facing each other across the ion beam. The potential of the electrode pair disposed in the center and the potentials of the electrode pairs disposed on both sides thereof are different, and the potentials of the electrode pairs disposed on both sides are the same. By this structure, the function is achieved of converging the ion beam in one direction without the energy of the ion beam being changed before and after the passage of the ion beam through the static lens. Such a static lens is, generally, widely known by the name of einzel lens or unipotential lens.

The reason that the convergence effect is exerted in the direction of the short side of the ion beam is as follows: Since the ion beam to be handled is a long and narrow beam such as a ribbon-like beam, when it is considered that the degrees of beam divergence in both directions are approximately the same, the spread of the ion beam due to the space charge effect is more conspicuous in the direction of the short side than in the direction of the long side.

Even if the ion beam is converged in the direction of the short side thereof by using a static lens immediately before the target as in Patent Reference 1, when an ion beam having a low energy is handled, it cannot be said that the influence on the spread of the ion beam due to the space charge effect is sufficiently suppressed.

The ion beam spreads under the influence of the space charge effect before being incident on the static lens. Consequently, the ion beam collides against a member in the beam line, so that the total amount of ion beam applied to the target is reduced. This increases the time required for achieving a desired implantation amount, which adversely affects the processing capability of the ion implanter that manufactures a semiconductor device.

The beam deflector has a comparatively large area compared with the other members in the beam line because it deflects the entire ribbon-like ion beam to shape it into a parallel beam. For this reason, the distance of beam conveyance in the beam deflector is long. The size of the gap between the magnetic poles provided in the beam deflector is determined so that a uniform magnetic field is efficiently supplied over the entire area in the direction of the long side of the ribbon-like ion beam. Specifically, considering the design size of the ion beam, the gap is designed so as to be slightly larger therethan. Thus, even according to the technology described in Patent Reference 1, the ion beam spreads because of the influence of the space charge effect when passing through the beam deflector, so that the ion beam collides against the magnetic poles or the like in the beam deflector.

[Prior Art Reference]
[Patent Reference]

[Patent Reference 1] Japanese Unexamined Patent Application Publication No. 2008-34360 (paragraphs 0034 to 0060, FIGS. 1 to 6)

SUMMARY

Exemplary embodiments of the present invention provide an ion implanter having a beam deflector and an einzel lens, which can suppress the spread of the ion beam due to the space charge effect in the beam deflector to efficiently convey the ion beam to the target.

An ion implanter, according to an exemplary embodiment of the invention, in which when a direction of travel of a central orbit of an ion beam is an x direction and two directions orthogonal to the x direction are a y direction and a z direction, respectively, a ribbon-like ion beam whose dimension in the y direction is larger than its dimension in the z direction is applied to a target, includes:

a beam deflector having a pair of magnetic poles facing each other in the z direction, the beam deflector being configured to deflect, by a magnetic field, an overall shape of the ion beam so as to be substantially parallel to the x direction;

insulating members provided on the respective magnetic poles;

at least one pair of electrodes provided on the insulating members so as to face each other across a space through which the ion beam passes in the z direction, having a dimension longer than the dimension of the ion beam in the y direction, and constituting an asymmetrical einzel lens in the direction of travel of the central orbit of the ion beam; and at least one power source configured to apply a voltage to the pair of electrodes.

With this, since the pair of electrodes provided in the beam deflector act to converge the ion beam in the direction of the short side thereof, the spread of the ion beam due to the space charge effect in the beam deflector is suppressed, so that the ion beam can be efficiently conveyed to the target.

The pair of electrodes may have a first side surface disposed on a side where the ion beam is incident and a second side surface disposed on a side where the ion beam exits, and the first and second side surfaces may vertically cross the direction of travel of the central orbit of the ion beam on an x-y plane when viewed from the z direction.

With this structure, the ion beam convergence effect by the electric field caused when a voltage is applied to the pair of electrodes can be exerted only in the z direction.

When a plurality of pairs of electrodes are disposed on the beam deflector, the pair of electrodes may be provided at least in the number of 2n−1 (n is an integer not less than 2), and potentials of odd-numbered electrode pairs counted from an entrance side of the beam deflector in the x direction may be set so as to be the same as each other and are set so as to be different from potentials of even-numbered electrode pairs.

With this structure, since one of the three pairs of electrodes included in the einzel lenses is used for both of the adjoining einzel lenses, the number of electrode pairs can be reduced compared with when a plurality of sets of conventional einzel lenses each including three electrode pairs are provided.

To decrease the number of the electrode sets, the magnetic poles may be electrically grounded.

With this, the parts of the magnetic poles situated on both sides of one electrode pair in the x direction can be used as odd-numbered electrode pairs.

The at least one pair of electrodes may have a plurality of parts divided in a direction vertical to the direction of travel of the central orbit of the ion beam on an x-y plane when viewed from the z direction, and the at least one power source may be provided at least in a number the same as the number of the divided parts of the electrode pair, and a different voltage is set for each part of the electrode pair.

With this, for each divided part of the electrode pair, a different convergence effect can be exerted on the ion beam.

The ion implanter may include a scanner configured to scan the ion beam in the y direction, and the voltage to be applied to the electrode pair may be changed according to a position of incidence, on the electrode pair, of the ion beam scanned by the scanner.

With this, the degree of convergence of the ion beam in the z direction can be adjusted to a desired one over the entire area of the ion beam in the y direction.

It is considered that the ion beam collides against the electrode pairs to cause metal particles and the metal particles flow into the target.

In order to prevent the metal particles from generating, the beam deflector may have a protecting member configured to prevent the ion beam from colliding against the electrode pair.

In order to obtain further convergence effect in the direction of the short side of the ion beam, the magnetic poles may have concave portions so as to face each other in the z direction, each of the concave portions having a first outer edge shape formed in an area on a side where the ion beam is incident when viewed from the z direction and a second outer edge shape formed in an area on a side where the ion beam exits, and the first and second outer edge shapes of the concave portions do not vertically cross the direction of travel of the central orbit of the ion beam on an x-y plane, respectively.

With this structure, it is expected that a further convergence effect in the direction of the short side of the ion beam is produced by fringe fields caused at the outer edges of the concave portions.

In order to facilitate the routing of the wiring, a through hole may be provided on surfaces of the magnetic poles where the pair of electrodes are disposed.

By doing this, the electric wiring for supplying a voltage to the pair of electrodes can be routed through the through hole from the outside of the beam deflector, so that the routing of the wiring is facilitated.

As another structure in order to facilitate the routing of the wiring, the concave portions may extend along the y direction in the magnetic poles, respectively.

Since the electric wiring can be routed into the magnetic poles from the y direction through the concave portions, the routing of the wiring is facilitated.

In order to facilitate the attachment of the electrode pair to the magnetic poles by using the other structure of routing of wiring, the pair of electrodes may have a dimension longer than the concave portions formed on the magnetic poles in the y direction and parts of the electrodes protruding from the concave portions may be bent in the z direction.

By adopting this structure, the electrode pairs can be attached from the magnetic pole surfaces in the y direction, the attachment work is facilitated.

According to the exemplary embodiment of the invention, it is possible to suppress the spread of the ion beam due to the space charge effect in the beam deflector to efficiently convey the ion beam to the target.

Other features and advantages may be apparent from the following detailed description, the accompanying drawings and the claims.

BRIEF DESCRIPTION OF THE DRAWINGS

FIG. 13 is a perspective view showing a state that a part of the electrode pair protruding from a concave portion in the y direction is bent in a z direction.

DETAILED DESCRIPTION

In the present invention, the direction of travel of the central orbit of the ion beam is the x direction, and two directions orthogonal to the x direction are the y direction and the z direction. The direction of the long side of the ribbon-like (long and narrow) ion beam implanted into the target is the y direction. Therefore, the x direction and the y direction change as appropriate in the position of the ion beam on the beam line when the ion beam is conveyed while undergoing deflection, convergence, scanning and the like on the beam line.

Figure 1:
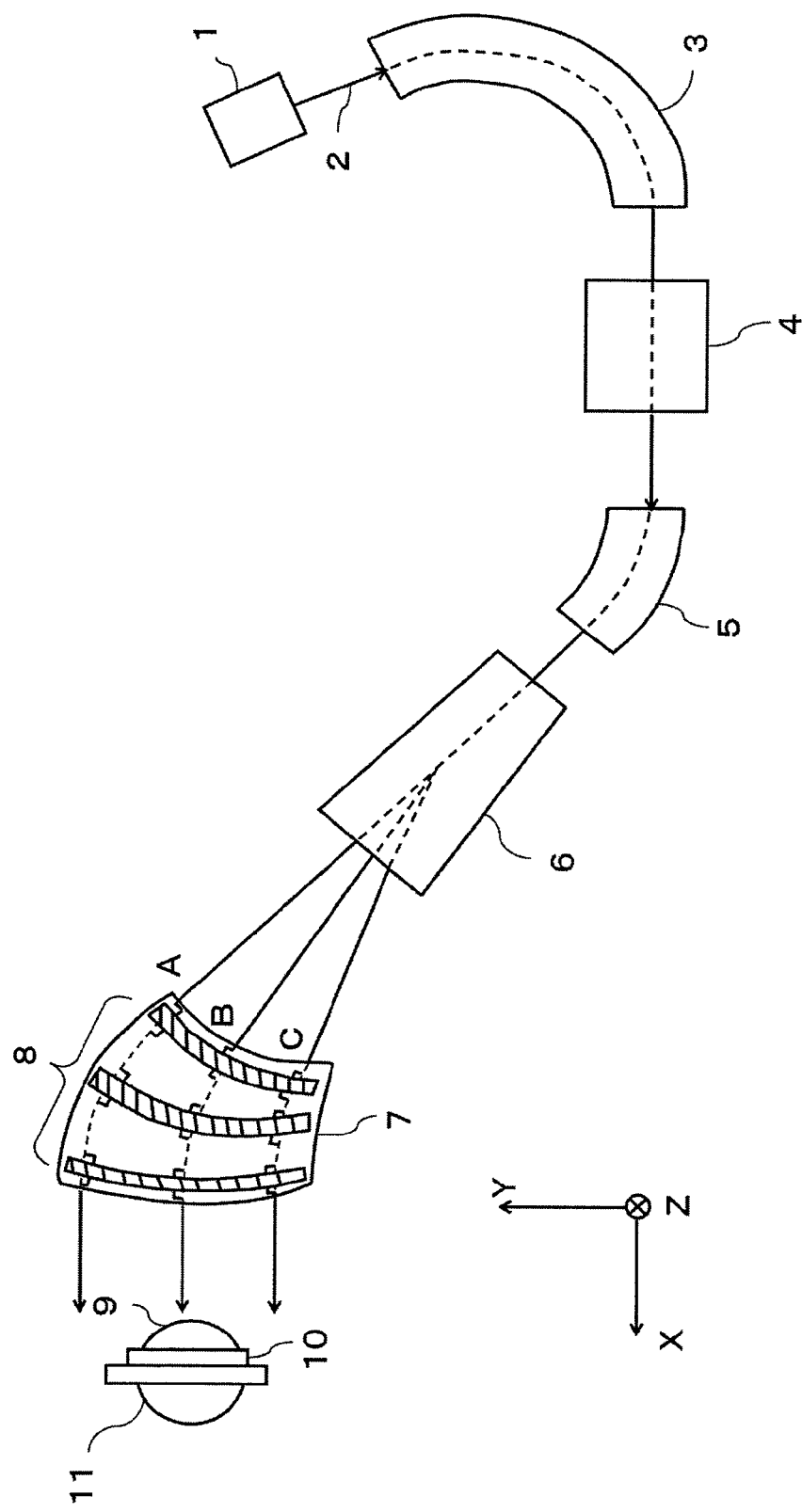
FIG. 1 is a plan view in an x-y plane showing an embodiment of an ion implanter according to the present invention.

FIG. 1 is a plan view showing an embodiment of the ion implanter according to the present invention. From a spot-like ion beam 2 emitted from an ion source 1, only ions, having a desired mass, to be implanted into a target 10 are selected by a mass analysis magnet 3 and a non-illustrated analysis slit cooperating with each other. Then, the ion beam 2 conveyed to an accelerating tube 4 is converted into an ion beam, having a desired energy, to be implanted into the target 10. Then, mass analysis is again performed by a second mass analysis magnet 5, and undesired ions, neutral particles and the like caused at the time of the energy conversion at the accelerating tube 4 are removed.

Then, the spot-like ion beam 2 is scanned on one plane by a scanner 6 to create a ribbon-like ion beam having a spread (length) in the direction of the scanning. Then, the scanned ion beam 2 is incident on a beam deflector 7. The orbit of the ion beam drawn from the ion source 1 to the scanner 6 is the central orbit of the ion beam, and is what is called the x direction in the present invention.

The beam deflector 7 deflects the ion beam 2 so that the overall shape of the ion beam is parallel in the x direction. Inside the beam deflector 7, at least one pair of electrodes are disposed so as to face each other in the z direction across the ion beam 2. In the embodiment of FIG. 1, three pairs of electrodes are provided in the beam deflector 7, and each is connected to a non-illustrated power source. In order to cause a static lens 8 including the three pairs of electrodes to function as a known einzel lens, when the electrode pairs disposed in the x direction are referred to as a first electrode pair, a second electrode pair and a third electrode pair, respectively, potential setting is made so that the potentials of the first electrode pair and the third electrode pair are the same as each other and different from the potential of the second electrode pair. By this structure, convergence of the ion beam in the z direction (in other words, of the ribbon-like ion beam in the direction of the short side thereof) is performed inside the beam deflector 7. The term convergence here does not mean focusing the ion beam to one point but means directing, or deflecting, focusing the ion beam to the side opposite to the spread direction in order to compensate for the spread of the ion beam due to the space charge effect. The pairs of electrodes disposed so as to face each other in the z direction may be formed of one electrically conducting member or may be formed of separate members. These structures may be similarly considered in other embodiments described later.

As shown in FIG. 1, the side surfaces of the electrode pairs on the incident side where the ion beam 2 is incident and on the exit side where the ion beam 2 exits are set so as to cross vertically to the direction of travel of the ion beam 2 when viewed from the z direction. By this setting, even if an electric field is caused between the electrode pairs by a voltage being applied to the electrode pairs, since the direction of the electric field and the direction of travel of the ion beam 2 are parallel to each other, the deflection of the ion beam 2 on the x-y plane is not harmed. That is, only the convergence effect in the z direction acts on the ion beam 2. Therefore, the deflection by the beam deflector 7 can be performed without any problems.

In the present invention, the one expressed as the direction of travel of the ion beam on the beam line from the scanner 6 to the exit of the beam deflector 7 is not limited to one direction. This can be understood by referring to the three lines drawn as representative lines representing orbits of the ion beams on the beam line from the scanner 6 to the target 10 in FIG. 1. Although the lines are approximately in the x direction on the x-y plane, when the direction of travel of each individual ion beam is viewed in a position in the direction of spread of the ion beam (y direction), the lines are slightly shifted from the x direction. For this reason, in the present invention, the directions of ion beams traveling in various directions are collectively called the direction of travel of the ion beam. Of the three lines, the central line corresponds to the central orbit of the ion beam, and is what is called the x direction in the present invention. The x, y and z coordinates drawn in FIG. 1 correspond to the ion beam applied to the target 10, and the directions of the x, y and z axes are changed in other positions as mentioned previously.

The ion beam 2 having passed through the beam deflector 7 is implanted into the target 10 supported by a holder 9. The target is a semiconductor substrate, and is, for example, a circular silicon wafer having a diameter of 300 mm. Ion implantation is performed on the entire surface of the target 10 by causing the target 10 to reciprocate in the z direction by a driving mechanism 11 supporting the holder 9.

Figure 2:
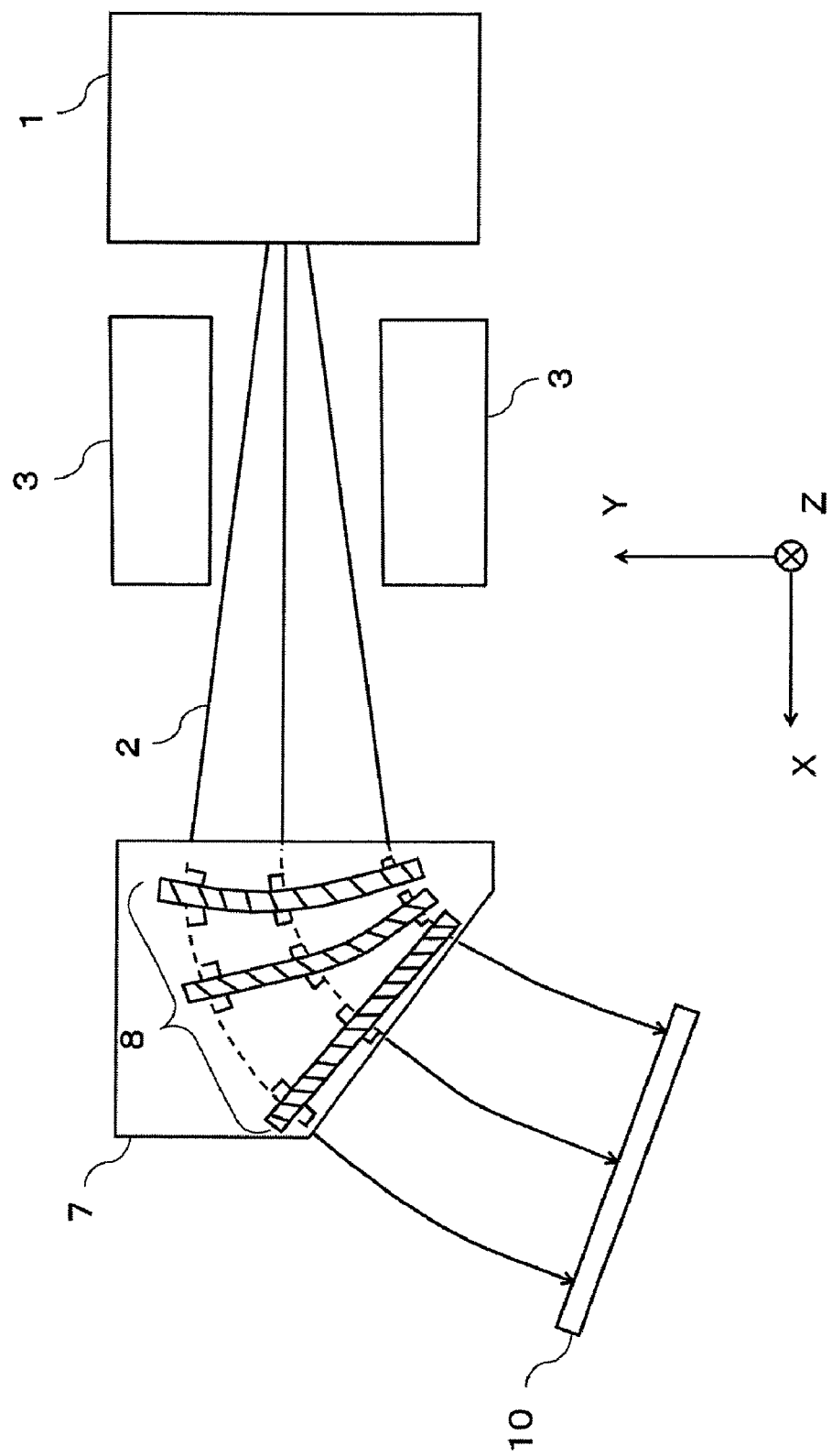
FIG. 2 is a plan view in an x-y plane showing another embodiment of the ion implanter according to the present invention.

FIG. 2 is a plan view showing another embodiment of the ion implanter according to the present invention. In this ion implanter, the ion beam 2 emitted from the ion source 1 is a ribbon-like ion beam having a spread in one dimension. In this ion implanter, as in the ion implanter of FIG. 1, only ions, having a desired mass, to be implanted into the target 10 are selected by the mass analysis magnet 3 and the non-illustrated analysis slit cooperating with each other. Then, the ion beam 2 is converged in the direction of the short side thereof and made parallel in the direction of spread thereof (y direction) by the beam deflector 7 having inside the static lens 8 including three pairs of electrodes. The ion implanter of FIG. 2 does not have the scanner 6. The present invention is applicable even to such an ion implanter.

Figure 3:
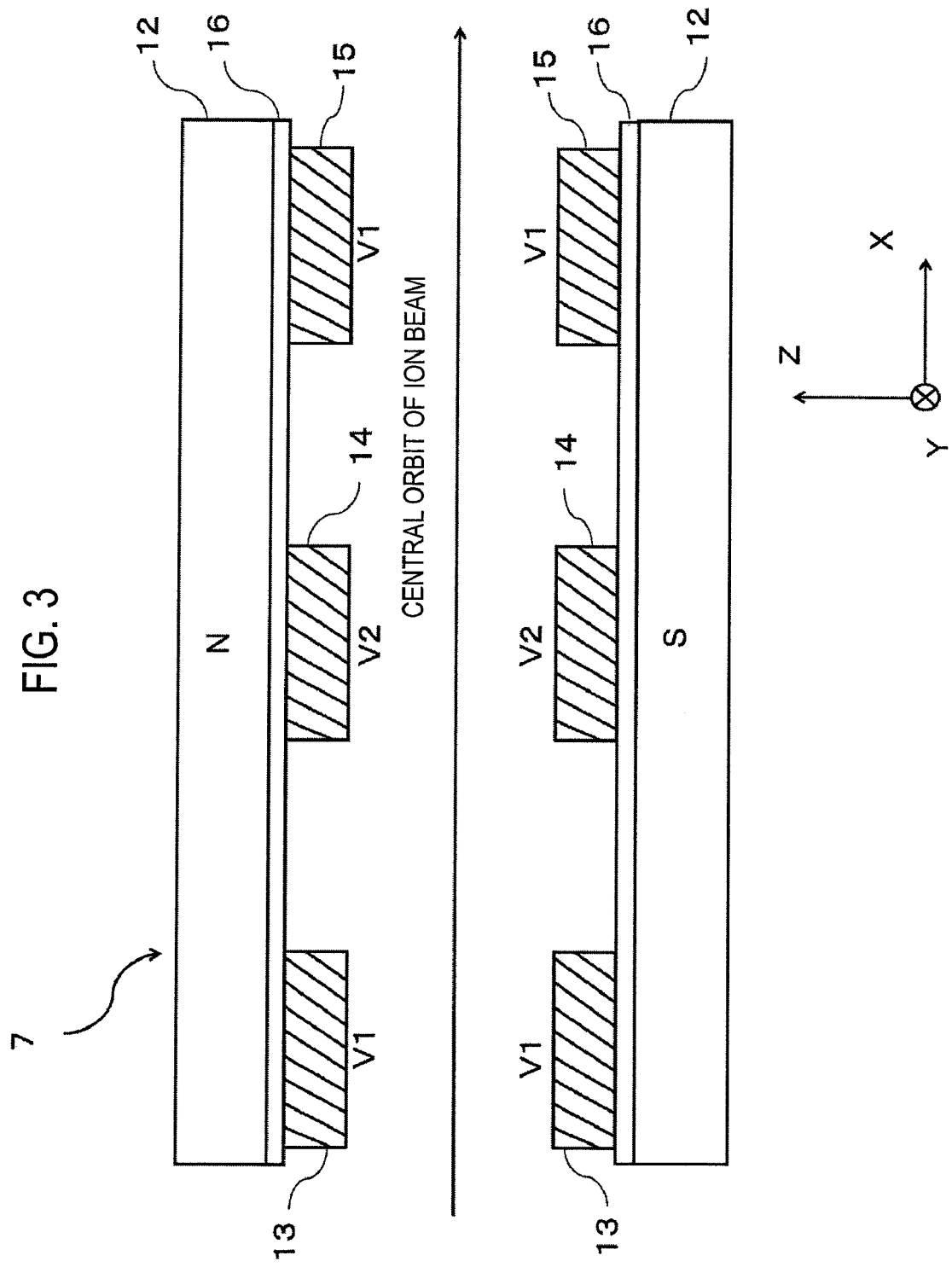
FIG. 3 is a cross section in an x-z plane showing a beam deflector provided with three pairs of electrodes.

Next, details of the electrode pairs in the beam deflector 7 will be described. FIG. 3 shows an x-z cross section of the beam deflector 7 including the central orbit of the ion beam. In the beam deflector 7, a pair of magnetic poles 12 are provided so as to face each other in the z direction across the ion beam. These magnetic poles 12 are coupled together in the y direction by a non-illustrated yoke. A coil is wound around the yoke so that a magnetic field is caused in one direction between the pair of magnetic poles 12. An electromagnet having such a structure is generally widely known as an electromagnet having a C-type yoke. In the example of FIG. 2, a magnetic field is caused from the upper side to the lower side between the magnetic poles 12 in the z direction. The arrow drawn between the magnetic poles 12 in the z direction in the figure represents the central orbit of the ion beam 2. While arrows are also drawn in FIGS. 4, 5, 7, 8 and 9 described later, these arrows also represent the central orbit of the ion beam 2 as in FIG. 3. Further, in FIGS. 3, 4, 5, 7 and 8, the lengths, in the x and z directions, of the electrode pairs are not limited to the drawn ones but may be either longer or shorter therethan.

On the magnetic poles 12, electrode pairs 13 to 15 are provided with an insulating member 16 in between. The material of the insulating member 16 is, for example, carbon.

To the first electrode pair 13, the second electrode pair 14 and the third electrode pair 15 arranged in the x direction, a voltage is applied by a non-illustrated power source. The potentials of the electrode pairs are set so that the potentials of the first electrode pair 13 and the third electrode pair 15 are V1 and the potential of the second electrode pair 14 is V2. In the present invention, the reference potential is the ground potential (0V), and with this as the reference, the potentials of the electrodes are set. The power source may be provided one for each electrode pair or may be provided one for each group of electrode pairs for which the same potential is set. The first electrode pair 13 and the third electrode pair 15 may be grounded. Further, a voltage-adjustable power source may be connected to the second electrode pair 14 so that the convergence effect on the ion beam can be adjusted as appropriate.

When the handled ion beam is an ion beam having a positive charge, it is desirable that the voltage applied to the electrode pairs by the power source be a negative voltage. If a positive voltage is applied, the electrons existing in the beam line are grabbed by the electrode pairs. Since this eliminates the electrons that suppress the space charge effect of the ion beam having a positive charge, the spread of the ion beam is more conspicuous. Therefore, by applying a negative voltage to the electrode pairs, it is possible to cause electrons having a negative charge to be reflected in the vicinity of the electrode pairs and remain in the beam line, so that the spread due to the space charge effect caused in the ion beam having a positive charge can be somewhat suppressed.

Figure 4:
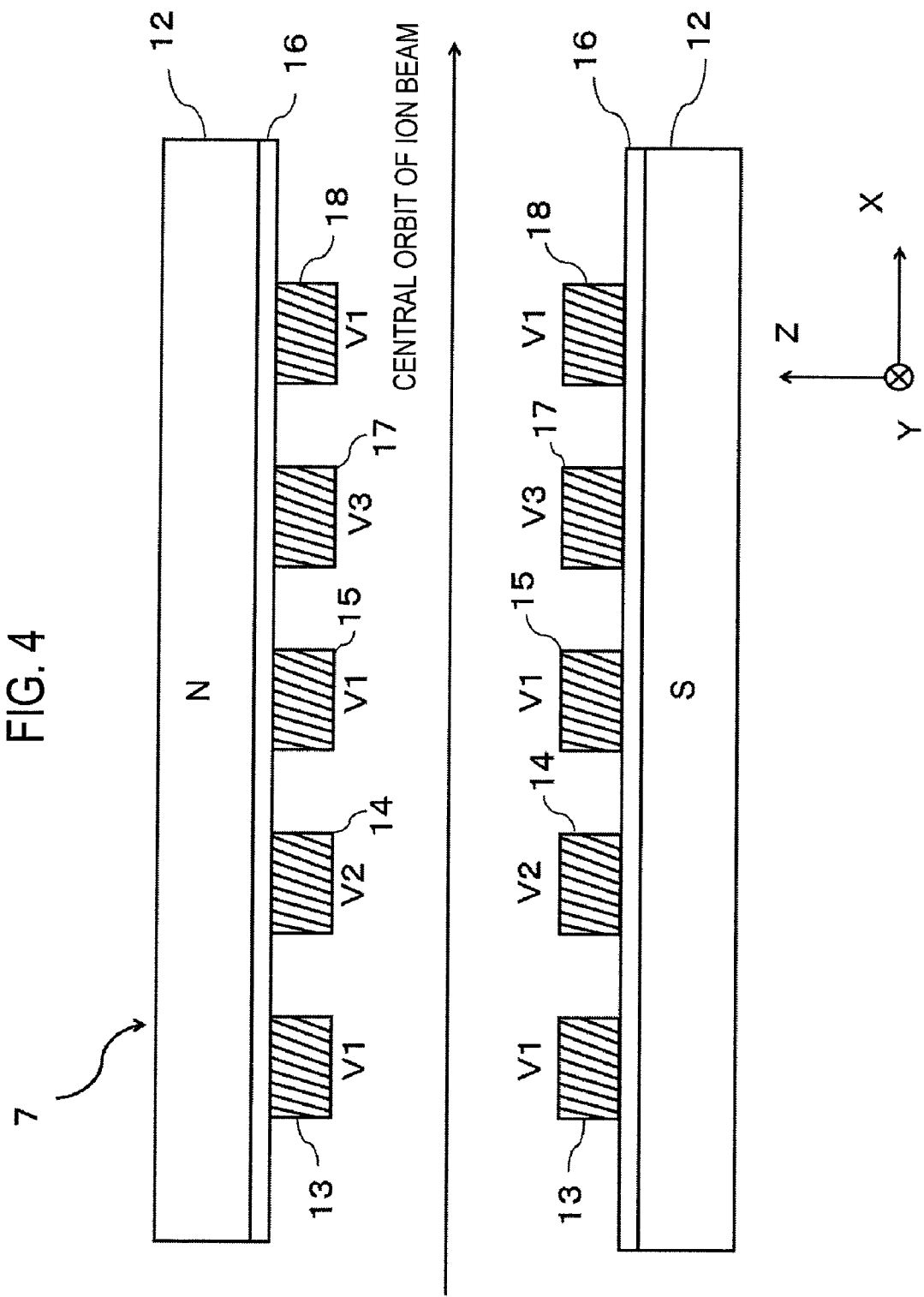
FIG. 4 is a cross section in an x-z plane showing a beam deflector provided with five pairs of electrodes.

FIG. 4 shows an example in which five pairs of electrodes are disposed in the beam deflector 7. This example is different from the example of FIG. 3 in that the number of electrode pairs is larger. To a first electrode pair 13, a second electrode pair 14, a third electrode pair 15, a fourth electrode pair 17 and a fifth electrode pair 18 arranged in the x direction, a voltage is applied by a non-illustrated power source. The potentials of the electrode pairs are set so that the potentials of the first electrode pair 13, the third electrode pair 15 and the fifth electrode pair 18 are V1, the potential of the second electrode pair 14 is V2 and the potential of the fourth electrode pair 17 is V3.

Normally, when two einzel lenses including three electrode pairs are provided, calculating simply, six electrode pairs are required. However, by using one of the electrode pairs included in the first einzel lens also as one of the electrode pairs included in the second einzel lens as shown in FIG. 4, the number of electrode pairs can be reduced. In the example of FIG. 4, the third electrode pair 15 is used as the electrode pair included in both of the einzel lenses.

While the number of electrode pairs is five in the example of FIG. 4, the number may be further increased. For example, when the number of electrode pairs is seven, the third electrode pair 15 and the fifth electrode pair 18 are used as the electrode pairs included in two einzel lenses. This enables seven electrode pairs to perform the function of three einzel lenses.

When generally shown, this can be said as follows: When the number of electrode pairs is 2n–1 (n is an integer not less than 2), the potentials of the odd-numbered electrode pairs are made the same as each other and different from the potentials of the even-numbered electrode pairs.

By adopting this structure, the function of a plurality of einzel lenses can be achieved with a small number of electrodes.

While the potentials of the odd-numbered electrode pairs (the second electrode pair 14 and the fourth electrode pair 17) are different in the example of FIG. 4, they may be the same potential. The potentials of the odd-numbered electrode pairs are set as appropriate in consideration of the degree of divergence of the ion beam due to the space charge effect with respect to the degree of the convergence effect and where in the beam deflector the convergence effect is caused.

On the other hand, when the ion beam 2 incident on the beam deflector 7 has a diameter larger than an assumed size under the influence of the space charge effect, it is considered that the ion beam 2 collides against the magnetic poles 12 of the beam deflector 7. When such a collision occurs, there is a possibility that the potential of the magnetic poles 12 varies. When the potential of the magnetic poles 12 is unstable, in the examples shown in FIGS. 3 and 4, the potentials set for the electrode pairs can be affected. Therefore, it is considered to electrically ground the magnetic poles 12.

Figure 5:
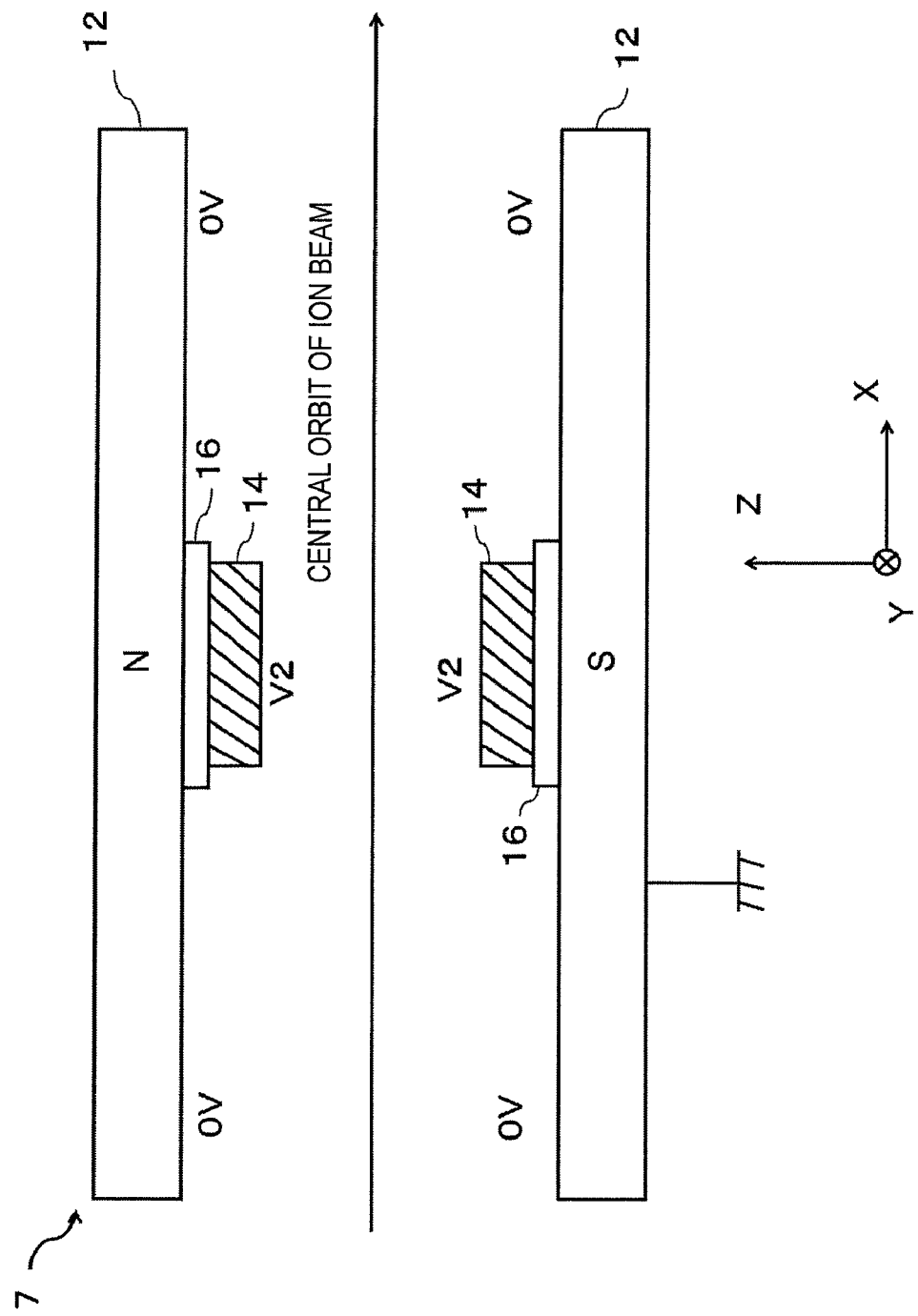
FIG. 5 is a cross section in an x-z plane showing a beam deflector provided with one pair of electrodes.

When the magnetic poles 12 are electrically grounded, a structure as shown in FIG. 5 may be used. In the example of FIG. 5, the number of electrode pairs is one. In the example shown in FIG. 5, the electrically grounded magnetic poles 12 are used as the first electrode pair 13 and the third electrode pair 15 shown in FIGS. 3 and 4. By adopting this structure, the function of an einzel lens can be achieved by one electrode pair.

In the structure of FIG. 5, to provide the function of two einzel lenses, one more electrode pair is provided in addition to the second electrode pair 14. For example, when the added electrode pair is the fourth electrode pair 17, the areas of the magnetic poles 12 existing between the second electrode pair 14 and the fourth electrode pair 17 function as the third electrode pair 15. With this structure, the function of a plurality of einzel lenses can be easily achieved with a small number of electrode pairs.

Figure 6:
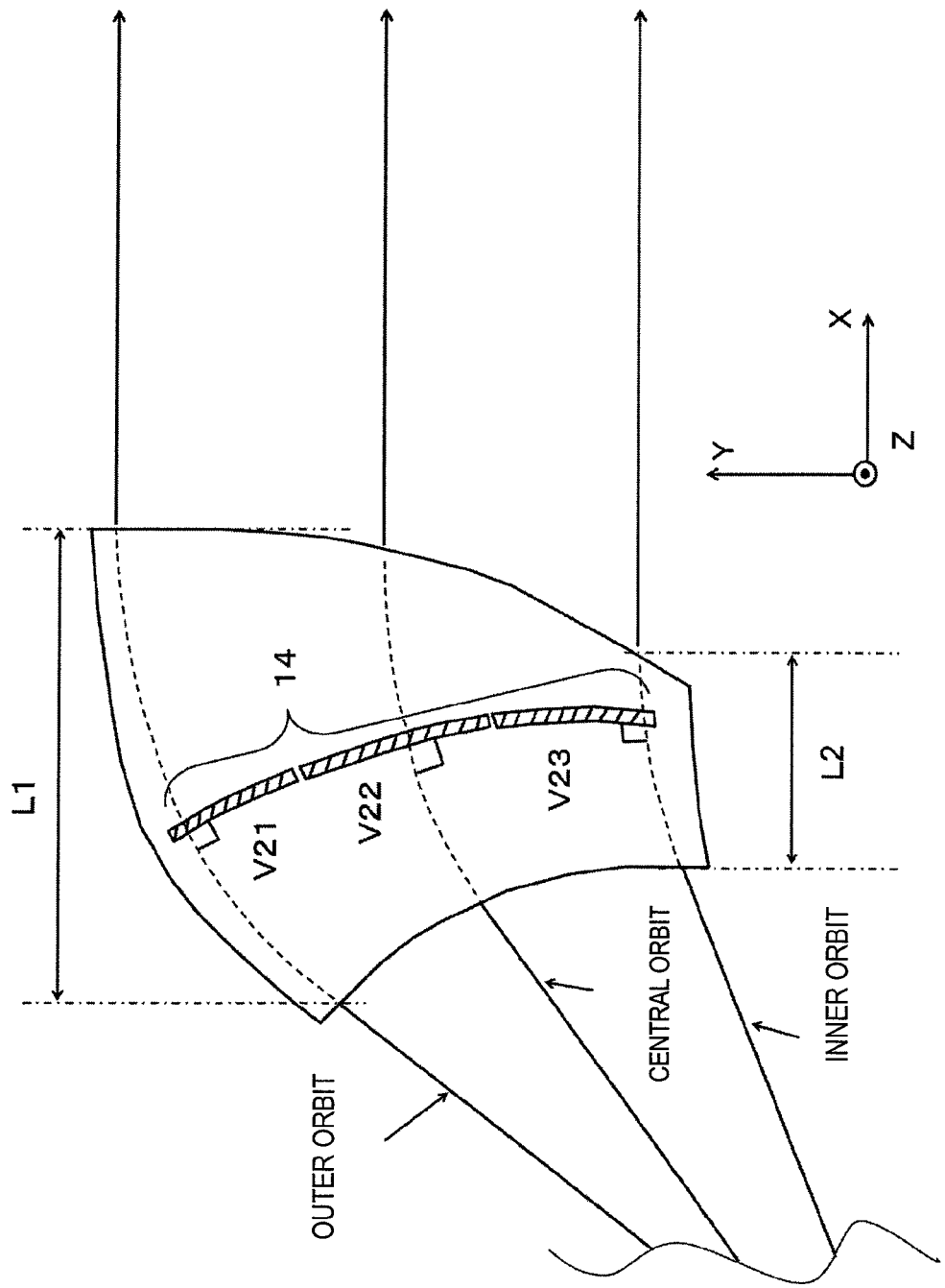
FIG. 6 is a plane view in an x-y plane showing a state in which the one electrode pair is divided in a direction of the length thereof.

The electrode pair may be divided into a plurality of parts in the direction of the length thereof. As an example thereof, a state in which the electrode pair of FIG. 5 is divided into three parts in the direction of the length thereof is shown in FIG. 6. When expressed differently, the direction of the length of the electrode pair can be said to be a direction vertical to the direction of travel of the ion beam on the x-y plane when viewed from the z direction.

As for the orbits of the ion beam 2 passing through the beam deflector 7, the orbit passing through the inner side and the orbit passing through the outer side in the beam deflector 7 are different in distance. Comparing the distances in the x direction, since the outer orbit is L1 and the inner orbit is L2, it is found that the outer orbit is longer than the inner orbit. When the distances are different, the influence of the space charge effect increases according to the distance of conveyance of the ion beam 2. Therefore, it can be said that the influence of the space charge effect is larger on the ion beam 2 traveling along the outer orbit than on the ion beam 2 traveling along the inner orbit.

Therefore, if the ion beam 2 where the conveyance distance is different between the inner orbit and the outer orbit is similarly converged irrespective of the orbit difference, it cannot be said that the influence of the space charge effect is sufficiently suppressed. Therefore, it is considered to cause a different convergence effect according to the position in the beam deflector 7 where the ion beam 2 passes by dividing the electrode pair in the direction of the length thereof and making the potentials of the divisional electrode pairs different like the structure shown in FIG. 6. Specifically, the potentials of the divisional electrode pairs are set so that a larger convergence effect acts on the ion beam 2 passing in the outer orbit than on the ion beam 2 passing in the inner orbit in the beam deflector 7.

Specifically, it is considered to provide a power source for setting the potentials of the divisional electrode pairs in the same number as the number of divisions and individually set the potentials of the electrode pairs. In the case of FIG. 6, three power sources are provided for the electrode pair divided into three parts. Then, the potentials of the three electrode pairs 14 arranged from the outer side to the inner side in the beam deflector 7 are set to V21, V22 and V23, respectively. When compared in absolute value, the relationship among the potentials V21 to V23 is V21>V22>V23.

While one electrode pair is divided and the same number of power sources as the number of divisions are provided in this example, when one of the electrode pairs is divided in a structure having a plurality of electrode pairs as shown in FIGS. 1 to 4, the power source for setting the potentials of the electrode pairs other than the divided electrode pair may be provided separately from the one for the divided electrode pair, or the power source used for the divided electrode pair may be used also for the electrode pairs other than the divided electrode pair.

While an example of the ion implanter having the scanner 6 is shown in FIG. 1, in the case of this example, it is considered to temporally change the potentials set for the electrode pairs. As widely known as a known technology, the scanner 6 changes the deflection amount of the ion beam 2 at regular intervals depending on time.

This will be described more concretely. In FIG. 1, focusing on the ion beam 2 incident on the beam deflector 7, the incident points thereof are denoted as A, B and C, respectively. In this case, it is assumed that the ion beam 2 is incident on the point A at the time t1, on the point B at the time t2 and on the point C at the time t3.

Then, the ion beam 2 incident on the point C is again incident on the point A after the time t3−t1. The ion beam 2 scanned by the scanner 6 at regular intervals T (T=2×(t3−t1)) as described above is incident on the points A to C.

As described in the example of FIG. 6, the distance to the target 10 differs according to which part, such as the outer side or the inner side, in the beam deflector 7 the ion beam 2 passes through. In the example of FIG. 1, for the ion beam 2 passing through the point A, the distance to the target 10 is longer than the orbits of the ion beam 2 passing through the points B and C. In the present invention, it is assumed that the ion beam 2 is continuously scanned. Although the ion beam 2 is not shown for the sake of simplification of the figure, the ion beam passing between the points A and B and between the points B and C is present.

In the present invention, focusing on such a temporal difference in the amount of deflection of the ion beam 2 by the scanner 6, it is also considered to temporally change the potentials set for the electrode pairs included in the static lens 8. That is, at the time when the orbit of the ion beam 2 passes through the outer side (the side of the point A in FIG. 1) in the beam deflector 7, the potentials of the electrode pairs are set to VX so that a large convergence effect is produced. Conversely, at the time when the orbit of the ion beam 2 passes through the inner side (the side of the point C in FIG. 1) in the beam deflector 7, the potential of the central electrode pair included in the static lens 8 is set to VY (when compared in absolute value, VX>VY) so that a convergence effect smaller than that when the ion beam 2 passes through the outer side is produced. By thus changing the potential setting of the electrode pairs according to the timing of the ion beam scanning, the difference in the degree of divergence of the ion beam due to the space charge effect caused by the difference in the distance to the target can be canceled out.

When the ion beam 2 incident on the beam deflector 7 has a diameter larger than an assumed size under the influence of the space charge effect, in addition to the problem of the ion beam 2 colliding against the magnetic poles 12 to vary the potential of the magnetic poles 12, the ion beam collides against the electrode pairs to cause a metal impurity to flow into the target 10. Such a problem is widely known as metal contamination.

Figure 7:
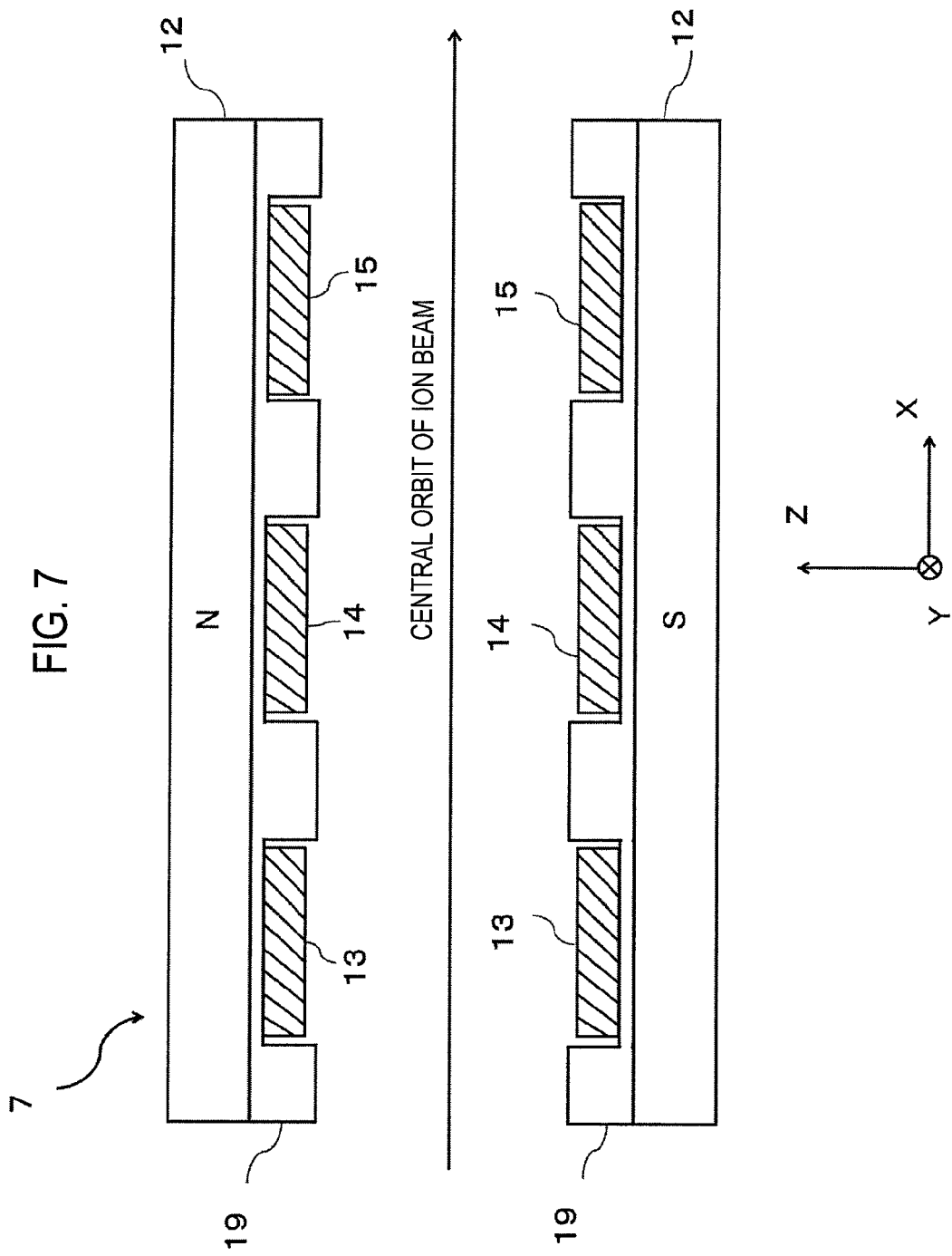
FIG. 7 is a cross section in an x-z plane showing a beam deflector provided with a protecting member.

To prevent metal contamination, it is considered to provide a protecting member 19 on each magnetic pole 12 and form concave portions for accommodating the electrode pairs in the protecting member 19 as shown in FIG. 7. By adopting this structure, since the electrode pairs are hiding in the concave portions when viewed from the ion beam 2 incident on the beam deflector 7, the possibility of the ion beam 2 colliding against the electrode pairs is reduced. By this, metal contamination can be suppressed.

As the material of the protecting member 19, a nonmetallic material is used. For example, carbon may be used like the insulating member 16 shown in FIGS. 3 to 5. In this case, the protecting member 19 may also function as the insulating member 16. This structure has an advantage in cost since it is unnecessary to provide a separate member. However, the insulating member 16 and the protecting member 19 may be provided separately. When the insulating member 16 and the protecting member 19 are provided as separate members, it is unnecessary to form the concave portions for accommodating the electrode pairs in the protecting member 19. A member of any configuration may be used as long as, in the z direction, it protrudes toward the side of the central orbit of the ion beam more than the thickness of the electrode pairs and does not extend over the area between the pairs of electrodes facing each other in the z direction.

Figure 8:
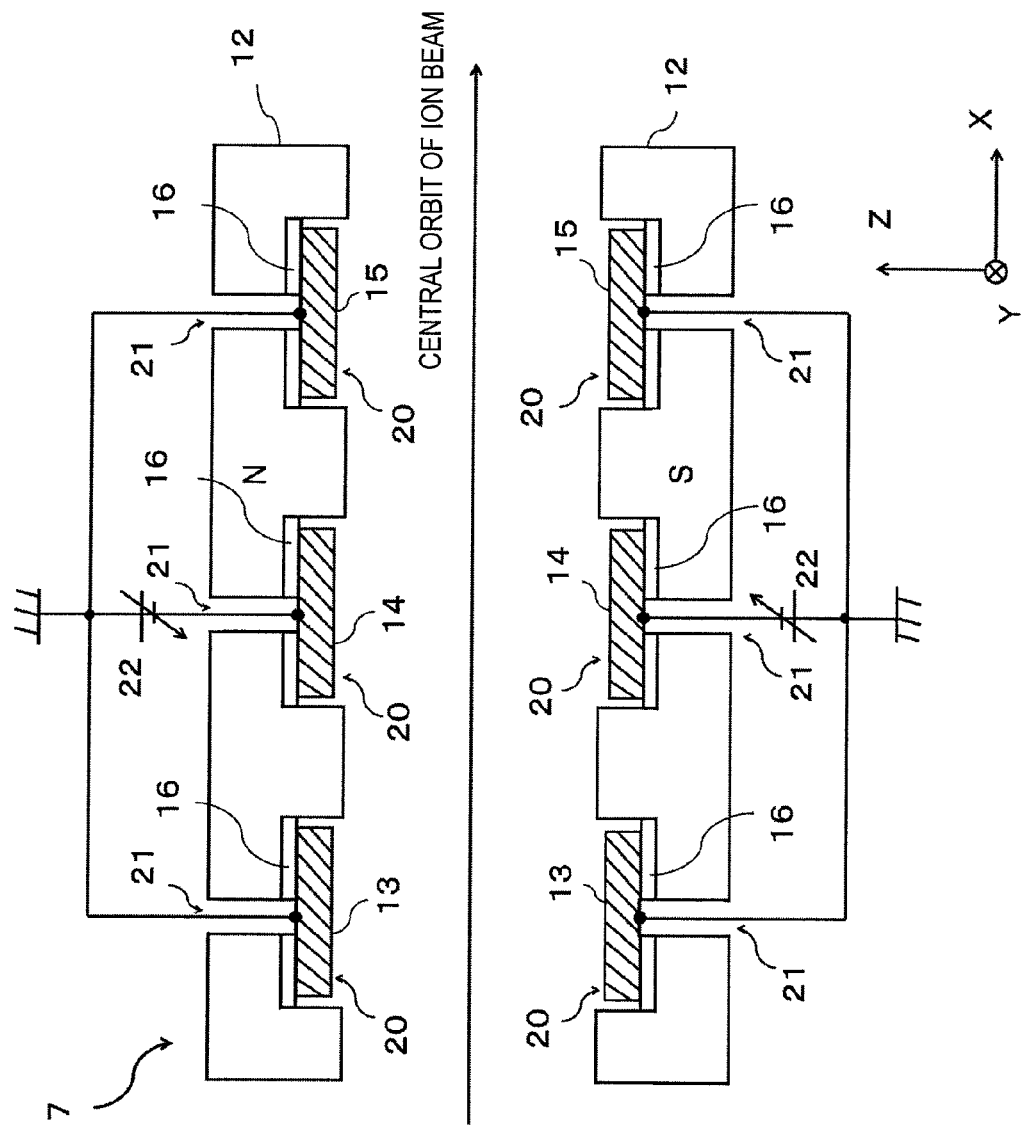
FIG. 8 is a cross section in an x-z plane showing a beam deflector provided with magnetic poles in which concave portions are provided in order to accommodate electrode pairs.

As for the electric wiring for supplying a voltage to the electrode pairs, when the electrode pairs are disposed, through an insulating member, on the magnetic poles 12 coupled to the C-type yoke, the electric wiring is routed through an opening of the yoke (the y direction of FIGS. 3 to 5 and 7). However, it is considered that this complicates the routing of the wiring. Therefore, it is considered to form through holes 21 in the magnetic poles 12 as shown in FIG. 8 and direct the electric wiring from a power source 22 into the magnetic poles from the z direction. With this structure, the routing of the electric wiring is easy. While the through holes 21 are also formed through the insulating members 16 in the example of FIG. 8, the electric wiring may be routed through a gap between the insulating member 16 and the magnetic pole 12 without the provision of the through hole through the insulating member 16.

To cause a further convergence effect to act on the ion beam 2 in the direction of the short side thereof, it is considered to form concave portions 20 on the magnetic pole surface as shown in FIG. 8. The concave portions 20 are formed so that the outer edge shape of the concave portion 20 formed in the area on the side where the ion beam 2 is incident and the outer edge shape of the concave portion 20 formed in the area on the side where the ion beam 2 exits do not vertically cross the direction of travel of the ion beam 2 on the x-y plane when viewed from the z direction.

Figure 9:
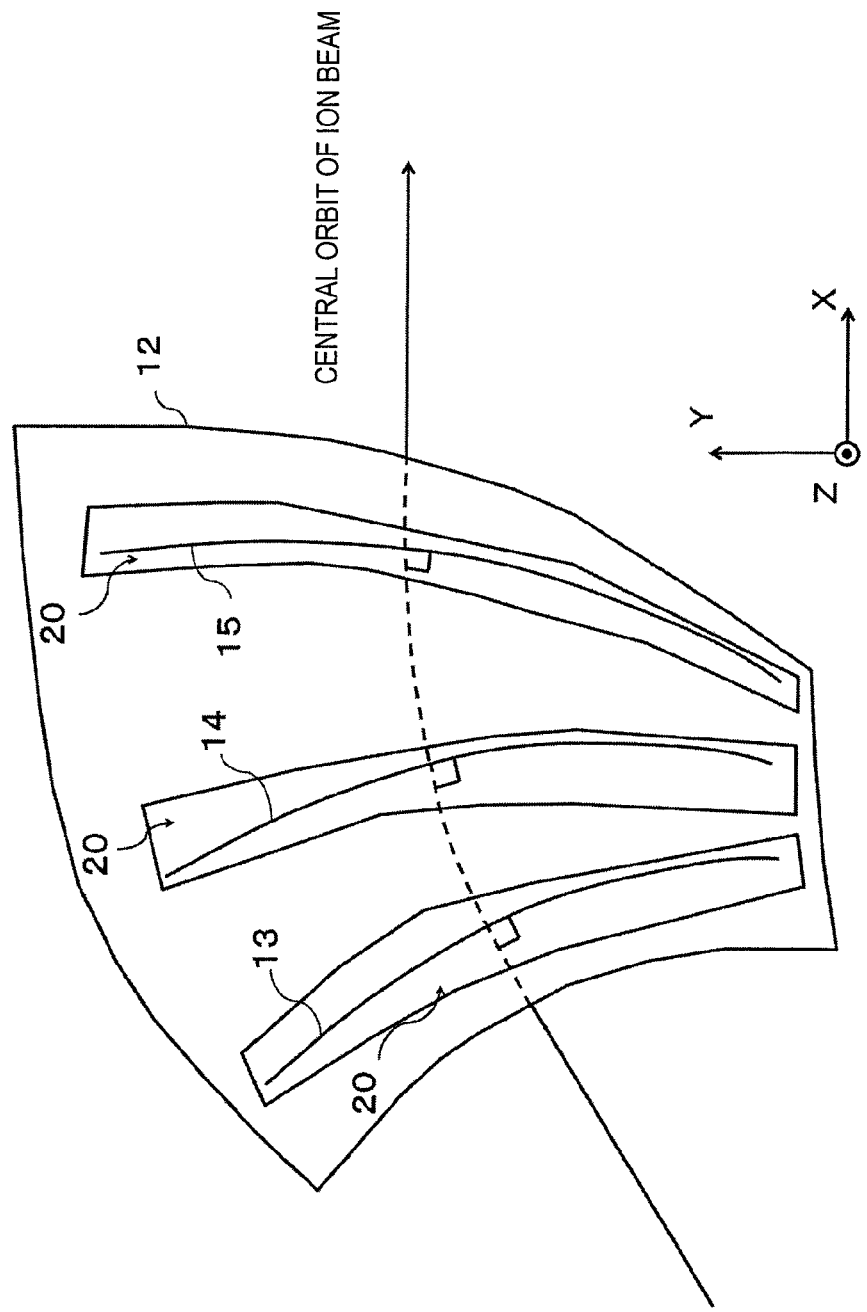
FIG. 9 is a plane view showing outer edge shapes in an x-y plane of the concave portions as shown in FIG. 8.

FIG. 9 shows the outer edge shapes of the concave portions 20 when viewed from the z direction. Focusing on the central orbit of the ion beam 2, the electrode pairs 13 to 15 vertically cross the direction of travel of the ion beam 2. On the contrary, the outer edge shape of the concave portion 20 in the area where the ion beam 20 is incident and the outer edge shape of the concave portion 20 in the area where the ion beam 20 exits do not vertically cross the direction of travel of the ion beam 2. In other words, the outer edge shapes of the concave portions 20 accommodating the electrode pairs are different from the shapes of the electrode pairs. The term being different here means not being similar. While focus is placed on the central orbit of the ion beam 2 for ease of explanation, the same applies to the other orbits of the ion beam.

The convergence effect caused by the outer edge shapes of the concave portions 20 will be described by using FIGS. 10 and 11.

Figure 10:
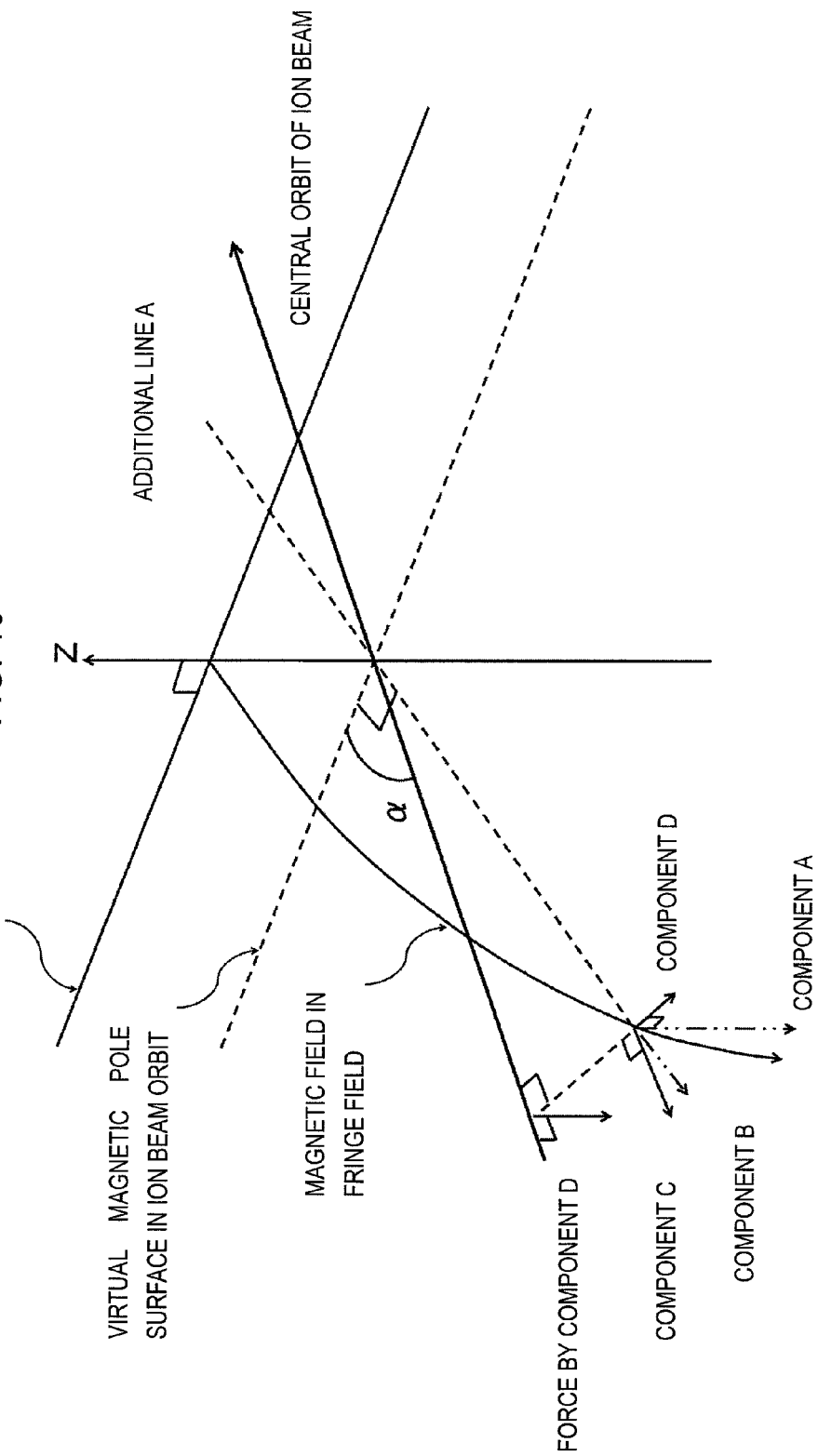
FIG. 10 is a view showing convergence effect caused by outer edge shapes of upper concave portions in a z direction.

FIG. 10 is a view showing what a force by a magnetic field caused on a magnetic pole surface at the outer edge of an upper concave portion in the z direction from the central orbit of the ion beam 2 exerts on the ion beam 2 passing therebelow.

At an end of the magnetic pole 12, that is, in a so-called fringe field, the magnetic field is caused not linearly in the z direction but in a direction as if it drew a parabola. By forming the concave portions 20 on the magnetic pole 12, such fringe fields are formed also at the outer edges of the concave portions 20.

For ease of explanation, it is assumed that the outer edge shapes of the concave portions 20 are linear. As described with reference to FIG. 9, the outer edge shapes are not vertical to the direction of travel of the ion beam 2. Therefore, when the shape of the magnetic pole surface at the outer edge of the concave portion is dropped in the z direction to the position the same as the central orbit of the ion beam 2 as shown in FIG. 10, the central orbit of the ion beam 2 and the virtual magnetic pole surface in the ion beam orbit cross at an angle α that is not a right angle.

Then, an additional line A vertically crossing the virtual magnetic pole surface is drawn. The magnetic field caused on the magnetic pole surface at the outer edge of the concave portion 20 can be divided into a component A orthogonal to the additional line A in the z direction and a component B parallel to the additional line A. Of the divisional components, the component A which is a magnetic field caused downward in the z direction coincides with the direction of the magnetic field caused in a flat part of the magnetic pole 12. Therefore, the magnetic field of this component A functions to deflect the ion beam 2 into a parallel beam at the beam deflector 7.

On the other hand, the component B can be further divided into a component C opposite to the direction of travel of the central orbit of the ion beam and a component D orthogonal to the direction of travel of the ion beam 2 and the z direction. The component C does not act on the ion beam 2 since it is parallel to the ion beam 2. The component D acts on the ion beam 2 since it vertically crosses the ion beam.

According to the Fleming's left-hand rule, the direction of the force exerted on the ion beam 2 by the component D is downward in the z direction.

Figure 11:
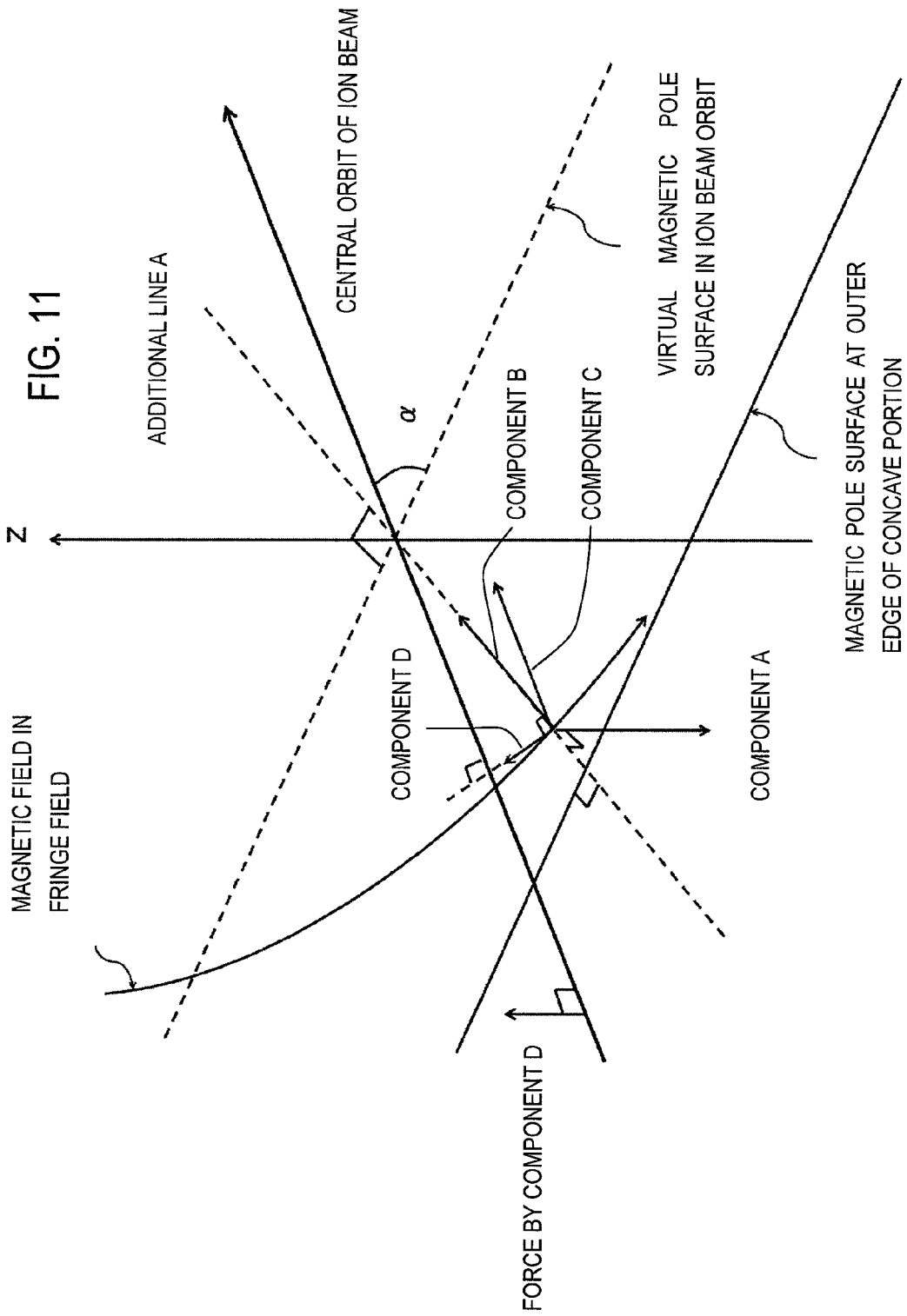
FIG. 11 is a view showing convergence effect caused by outer edge shapes of lower concave portions in a z direction.

FIG. 11 is a view showing what a force by a magnetic field caused on a magnetic pole surface at the outer edge of a lower concave portion in the z direction from the central orbit of the ion beam exerts on the ion beam 2 passing therebelow.

Since the outer edge shapes of the concave portions face each other in the z direction, from the relationship with FIG. 10, the outer edge shapes of the concave portions 20 are also linear in FIG. 11. When the shape of the magnetic pole surface at the outer edge of the concave portion is raised in the z direction to the position the same as the central orbit of the ion beam 2 as in the case of FIG. 10, the central orbit of the ion beam 2 and the virtual magnetic pole surface in the ion beam orbit cross at an angle α that is not a right angle.

Then, an additional line A vertically crossing the virtual magnetic pole surface is drawn. The magnetic field caused on the magnetic pole surface at the outer edge of the concave portion 20 can be divided into a component A orthogonal to the additional line A in the z direction and a component B parallel to the additional line A. Of the divisional components, the component A which is a magnetic field caused downward in the z direction coincides with the direction of the magnetic field caused in a flat part of the magnetic pole 12. Therefore, the magnetic field of this component A functions to deflect the ion beam 2 into a parallel beam at the beam deflector 7.

On the other hand, the component B can be further divided into a component C in a direction the same as the direction of travel of the central orbit of the ion beam and a component D orthogonal to the direction of travel of the ion beam 2 and the z direction. The component C does not act on the ion beam 2 since it is parallel to the ion beam 2. The component D acts on the ion beam 2 since it vertically crosses the ion beam.

According to the Fleming's left-hand rule, the direction of the force exerted on the ion beam 2 by the component D is upward in the z direction.

As described above, the ion beam 2 receives a downward force by the magnetic field caused from the magnetic pole at the outer edge of the upper concave portion 20 in the z direction and receives an upward force by the magnetic field caused from the magnetic pole at the outer edge of the lower concave portion 20 in the z direction, so that the ion beam 2 is converged in the direction of the short side thereof. Thereby, a further convergence effect can be obtained in addition to the convergence effect in the direction of the short side of the ion beam 2 by the electrode pairs, so that the effect of suppressing the divergence of the ion beam due to the space charge effect can be sufficiently obtained.

Figure 12:
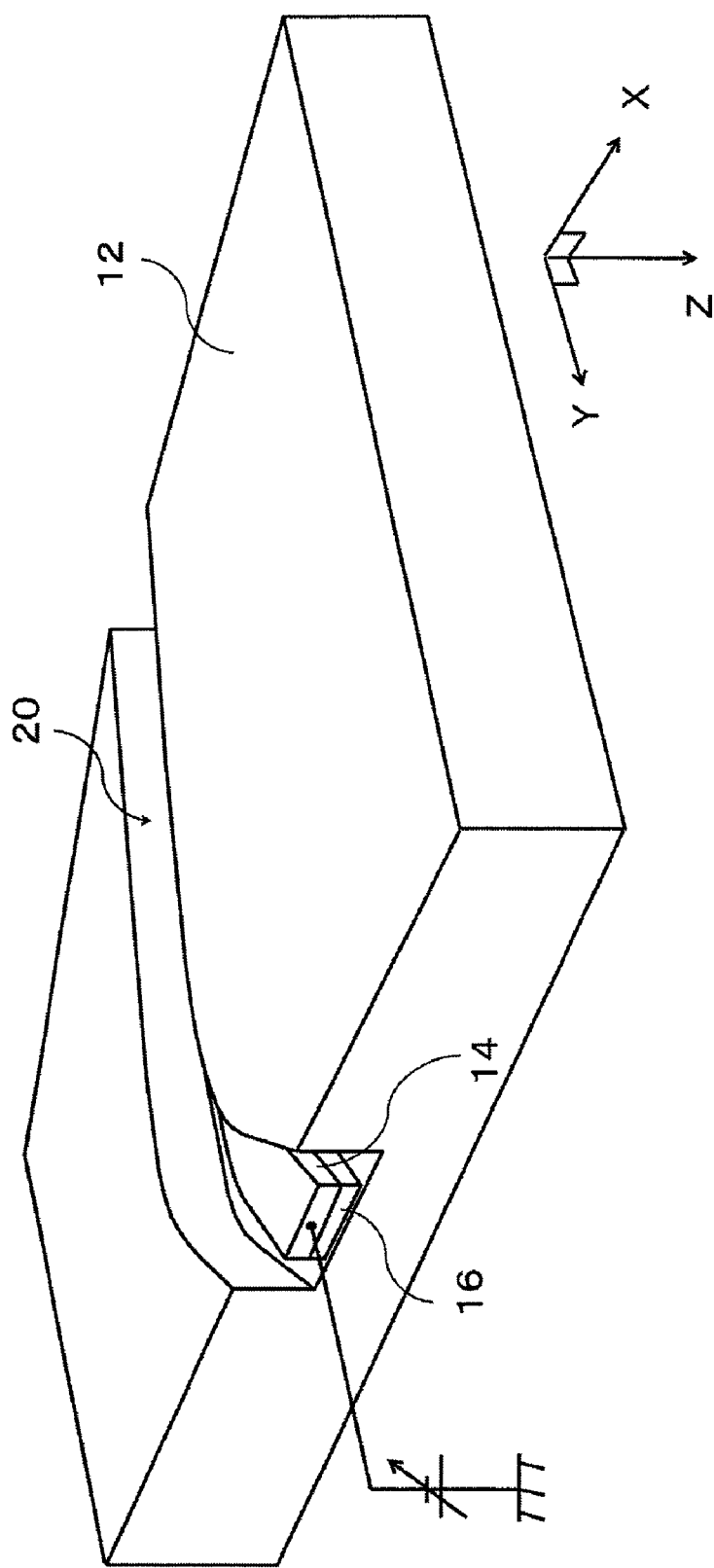
FIG. 12 is a perspective view showing a state in which the concave portions pass through the magnetic poles in the y direction.

Further, when such concave portions 20 are provided, a structure as shown in FIG. 12 is considered as a simple routing structure of electric wiring for supplying a voltage to the electrode pairs. FIG. 12 shows a state in which the concave portions 20 provided on a pair of magnetic poles 12 pass through the magnetic poles 12 in the y direction. Normally, the electric wiring is routed to the electrode pair 14 provided in the concave portions from the z direction. However, when the structure shown in FIG. 12 is used, the electric wiring can be easily routed from the y direction. While the concave portion passes through both sides of the magnetic pole in the y direction in FIG. 12, a structure in which the concave portion passes through only one side may be adopted.

When the electrode pairs are attached to the magnetic poles 12 through the insulating member 16 from the z direction, since the magnetic poles 12 are present so as to face each other in the z direction, the attachment is onerous.

Therefore, to eliminate the onerousness of the attachment work, when the concave portions 20 pass through the magnetic poles 12 in the y direction, a structure as shown in FIG. 13 is considered.

In FIG. 13, the size of the electrode pair 14 in the y direction is longer than the concave portion 20, the part of the electrode pair 14 protruding from the concave portion 20 is bent in the z direction, and the electrode pair 14 is fixed to the magnetic pole 12 through the insulating member 16 from the side surface of the magnetic pole 12 situated in the y direction by using a non-illustrated fixing member or fixing jig. By adopting this structure, the attachment of the electrode pair is facilitated.

While only one of a pair of magnetic poles 12 is shown in FIGS. 12 and 13, since the structure of the other magnetic pole 12 is the same, the other magnetic pole 12 is not shown.

While embodiments of the structures and the like of the beam deflector and the electrode pairs and magnetic poles provided therein in the present invention have been described, it is to be noted that various improvements and modifications may be made without departing from the gist of the invention.

What is claimed is:

1. An ion implanter in which when a direction of travel of a central orbit of an ion beam is an x direction and two directions orthogonal to the x direction are a y direction and a z direction, respectively, a ribbon-like ion beam whose dimension in the y direction is larger than its dimension in the z direction is applied to a target, the ion implanter comprising:
   a beam deflector having a pair of magnetic poles facing each other in the z direction, the beam deflector being configured to deflect, by a magnetic field, an overall shape of the ion beam so as to be substantially parallel to the x direction;
   insulating members provided on the respective magnetic poles;
   at least one pair of electrodes provided on the insulating members so as to face each other across a space through which the ion beam passes in the z direction, having a dimension longer than the dimension of the ion beam in the y direction, and constituting an asymmetrical einzel lens in the direction of travel of the central orbit of the ion beam; and at least one power source configured to apply a voltage to the pair of electrodes.

2. The ion implanter according to claim 1,
wherein the pair of electrodes have a first side surface disposed on a side where the ion beam is incident and a second side surface disposed on a side where the ion beam exits, and
wherein the first and second side surfaces vertically cross the direction of travel of the central orbit of the ion beam on an x-y plane when viewed from the z direction.

3. The ion implanter according to claim 1,
wherein the pair of electrodes are provided at least in the number of 2n−1 (n is an integer not less than 2), and
wherein potentials of odd-numbered electrode pairs counted from an entrance side of the beam deflector in the x direction are set so as to be the same as each other and are set so as to be different from potentials of even-numbered electrode pairs.

4. The ion implanter according to claim 1,
wherein the magnetic poles are electrically grounded.

5. The ion implanter according to claim 1,
wherein the at least one pair of electrodes have a plurality of parts divided in a direction vertical to the direction of travel of the central orbit of the ion beam on an x-y plane when viewed from the z direction, and
wherein the power source is provided at least in a number the same as the number of the divided parts of the electrode pair, and a different voltage is set for each divided part of the electrode pair.

6. The ion implanter according to claim 1, comprising:
a scanner configured to scan the ion beam in the y direction,
wherein the voltage to be applied to the electrode pair is changed according to a position of incidence, on the electrode pair, of the ion beam scanned by the scanner.

7. The ion implanter according to claim 1,
wherein the beam deflector has a protecting member configured to prevent the ion beam from colliding against the electrode pair.

8. The ion implanter according to claim 1,
wherein through holes are provided on surfaces of the magnetic poles where the pair of electrodes are disposed.

9. The ion implanter according to claim 1,
wherein the magnetic poles have concave portions facing each other in the z direction, each of the concave portions having a first outer edge shape formed in an area on a side where the ion beam is incident and a second outer edge shape formed in an area on a side where the ion beam exits, and
wherein the first and second outer edge shapes of the concave portions do not vertically cross the direction of travel of the central orbit of the ion beam on an x-y plane when viewed from the z direction, respectively.

10. The ion implanter according to claim 9,
wherein the concave portions extend along the y direction in the magnetic poles, respectively.

11. The ion implanter according to claim 10,
wherein the pair of electrodes have a dimension longer than the concave portions formed on the magnetic poles in the y direction and parts of the electrodes protruding from the concave portions are bent in the z direction.

* * * * *